United States Patent [19]
Verhaege et al.

[11] Patent Number: 5,557,072
[45] Date of Patent: Sep. 17, 1996

[54] SUPERCONDUCTIVE CONDUCTOR PRESENTING IMPROVED PROTECTION AGAINST PARTIAL TRANSITIONS

[75] Inventors: Thierry Verhaege, Saulx les Chartreux; Alain Février, Maurepas; Alain Lacaze, Essert; Yves Laumond, Danjoutin, all of France

[73] Assignee: GEC Alsthom SA, Paris, France

[21] Appl. No.: 858,190

[22] Filed: Mar. 26, 1992

[30] Foreign Application Priority Data

Mar. 28, 1991 [FR] France .................. 91 03770

[51] Int. Cl.$^6$ ..................................... H01B 12/00
[52] U.S. Cl. .......................... 174/125.1; 505/887
[58] Field of Search ............... 174/125.1; 505/884, 505/886, 887

[56] References Cited

U.S. PATENT DOCUMENTS 3,559,127  1/1971  Schindler .............. 174/125.1 X
3,657,466  4/1972  Woolcock et al. ....... 174/125.1 X
3,760,092  9/1973  Woolcock et al. .......... 174/125.1
4,409,425  10/1983  Ries ......................... 174/125.1 X

FOREIGN PATENT DOCUMENTS 0288023  11/1990  Japan ................. 174/125.1

Primary Examiner—Hyung S. Sough
Attorney, Agent, or Firm—Sughrue, Mion, Zinn, Macpeak & Seas

[57] ABSTRACT

A superconductive conductor protected against partial transitions, the conductor comprising a superconductive region made up of superconductive filaments embedded in a non-superconductive metal matrix, and a non-superconductive metal region, wherein the cold resistivity of the non-superconductive metal region is less than half the overall cold resistivity of the superconductive region in the non-superconductive state, the superconductive region and the non-superconductive metal region being merely in mechanical contact, without cohesion.

3 Claims, 1 Drawing Sheet

SUPERCONDUCTIVE CONDUCTOR PRESENTING IMPROVED PROTECTION AGAINST PARTIAL TRANSITIONS

The present invention relates to a superconductive conductor protected against partial transitions.

BACKGROUND OF THE INVENTION

Superconductive conductors may be subjected accidentally or under special operating conditions to partial transitions, i.e. to a limited region of the conductor switching to the resistive state. This region is initially very small, but it grows progressively because of Joule effect heating. The intense and rapid heating and the high voltages that appear across the region that has changed state run the risk of damaging the conductor.

Superconductive conductors generally contain a large fraction of copper or of aluminum, which fraction is judged necessary for protecting them in the event of a transition. When cold, the resistivity of copper or aluminum is 1,000 to 10,000 times smaller than the resistivity of the superconductive material after transition or of a matrix alloy such as cupro-nickel, thus making it possible to reduce the Joule effect considerably and the heating that results therefrom for given current.

In general, the transition propagates slowly so the current falls off slowly as well, too slowly to prevent thermal damage. Various protection systems are therefore used.

Active protection devices are known having the function of detecting a transition and of acting on the power supply circuit so as to cause the current to decrease more quickly. However, the rate at which the current decreases is limited by the maximum voltage that can be accepted across the terminals of a superconductive coil.

In order to provide an improved system of protection against partial transitions, a passive protection system is proposed providing particularly high propagation speeds for the region that has changed state.

SUMMARY OF THE INVENTION

This has been made possible by the presence of one or more strands or tapes having low resistance but not being superconductive, and being put merely into mechanical contact, but without cohesion, with one or more superconductive strands.

The present invention thus provides a superconductive conductor protected against partial transitions, the conductor comprising a superconductive region made up of superconductive filaments embedded in a non-superconductive metal matrix, and a non-superconductive metal region, wherein the cold resistivity of the non-superconductive metal region is less than half the overall cold resistivity of the superconductive region in the non-superconductive state, the superconductive region and the non-superconductive metal region being merely in mechanical contact, without cohesion.

The invention relates to a passive protection system in which it is desired that the region that has changed state should extend quickly, thereby causing current to fall off quickly because of its electrical resistance.

BRIEF DESCRIPTION OF THE DRAWING

Embodiments of the invention are described by way of example with reference to the accompanying drawing, in which.

DETAILED DESCRIPTION

Figure 1:
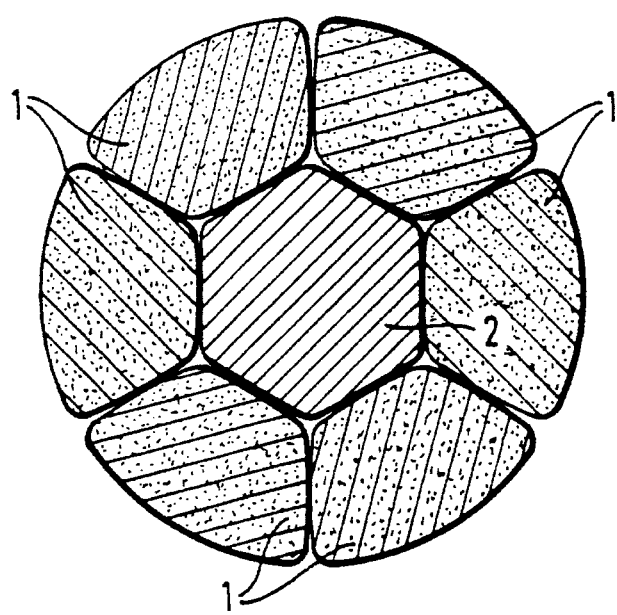
FIG. 1 is a cross-section through a superconductive conductor of the invention.

FIG. 1 is a cross-section through a superconductive conductor of the invention. It is made up of superconductive strands 1 disposed around a central strand 2 made of a material that is not superconductive. Each superconductive strand may be made of filaments, e.g. niobium-titanium filaments embedded in a matrix of cupro-nickel alloy. The central strand 2 is made in whole or in part of a low-resistance non-superconductive material such as copper or aluminum.

During manufacture of the superconductive conductor, the central strand 2 is placed merely in mechanical contact with the superconductive strands 1. The term "mechanical contact" is used to mean that the central strand is in the immediate proximity of the superconductive strands, but without cohesion as could be obtained, for example, by hot extrusion or by tinning. Lack of cohesion between the central strand and the superconductive strands means that the central strand must be capable of being separated from the superconductive strands merely by mechanical action.

The materials making up the superconductive conductor are selected so that the resistivity of the central strand is much lower than the resistivity of the superconductive strands when in the non-superconductive state (for example the central strand may be made of copper while the matrix of the superconductive strands may be made of cupro-nickel).

With such resistivities and with no cohesion between the central strand and the superconductive strands, the propagation speed of a transition is increased because of the current transfer phenomenon.

Figure 2:
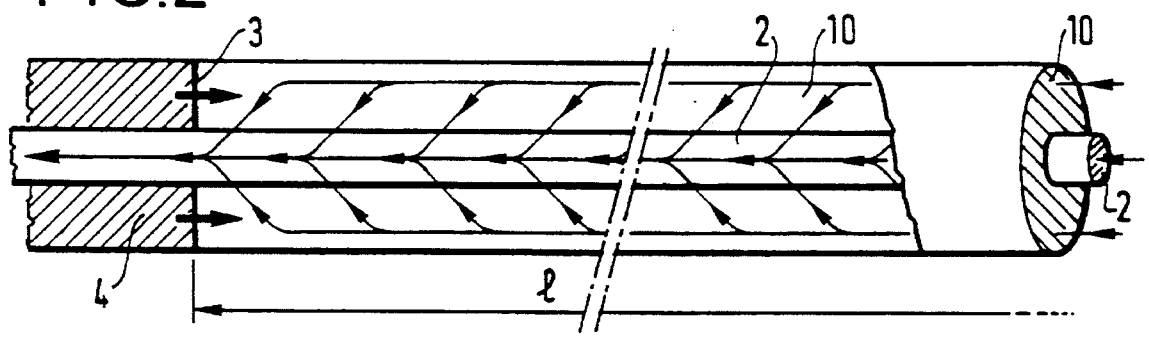
FIG. 2 is a longitudinal section through a superconductive conductor of the invention with a region that has changed state propagating therealong.

FIG. 2 shows this current transfer phenomenon. In this figure, reference 10 designates the set of superconductive strands surrounding the central strand 2. The conductor is shown as having a propagation front 3 of the region that has changed state moving in the direction indicated by the arrows. The shaded region 4 represents the region that has already changed state.

The absence of cohesion between the central strand and the other strands sets up contact resistance that ensures a current transfer length 1 between the superconducting strands and the central strand that is long relative to the diameter of the conductor. Current lines representing the transfer of current from the superconductive region to the central strand are shown diagrammatically in FIG. 2.

In the region that has changed state, the low-resistance central strand conveys a large fraction of the current whereas all of the current is conveyed by the superconductor at a position that is far enough ahead of the propagation front. To enable the current to pass from one to the other, it is necessary to have a large cross-section for it to pass through, and therefore for the transfer length 1 to be long. If there were no contact resistance, then the length of the transfer region would be shorter, and comparable to the diameter of the conductor.

Ahead of the propagation front, the Joule effect in the current transfer region produces the increase in temperature necessary for the front to advance quickly. An increase in propagation speed of one or two orders of magnitude can easily be obtained relative to conventional superconductive conductors in which the only force driving propagation is heat diffusion from the region that has changed state.

By way of example, for a superconductive conductor of the type shown in FIG. 1 (six superconductive strands around a central strand) having a diameter of 0.5 mm and having a central strand with a diameter of 0.18 mm, a transfer length l of about 30 mm is obtained.

Without contact resistance between the central strand and the superconductive strands, the transition propagation front moves at a speed of about 30 meters per second (m/s) to about 100 m/s. With contact resistance, this speed may exceed 1 km/s.

The invention makes it possible to omit a portion or even all of the low-resistance metal within the superconductive region, said portion (or totality) being replaced by a smaller quantity of said metal in the non-superconductive region. This provides numerous auxiliary advantages:

- increased overall current density;
- increased resistance per unit length of the conductor, thereby further accelerating the rate at which current drops;
- a reduction in losses due to induced currents under varying conditions; and
- it becomes possible to use matrices of copper alloyed with nickel, manganese, etc., for the purpose of avoiding proximity effects in spite of the small spacing.

With different dimensions, the invention can be applied to a conductor for alternating current (50 Hz–60 Hz) or to a conductor constituting a pulsed field coil, for example. The conductor may constitute a basic component from which higher-capacity conductor assemblies are made up.

In a 50 Hz–60 Hz version, the strands may be about 0.2 mm across and they may be twisted at a pitch of 1 mm. They may comprise 0.15 μm filaments of niobium-titanium having no copper at a spacing of 0.15 μm in a cupro-nickel matrix. The central strand may then include about 10% copper in the form of filaments in a cupro-nickel matrix.

In a version adapted to producing intense pulsed fields, the strands are twisted, and have diameters that may be in the range 0.5 mm to 1 mm (higher values could compromise their electromagnetic stability). Advantageously they include small diameter niobium-titanium filaments (diameter about 1 μm) at a spacing of 0.15 μm in a cupro-nickel matrix. Such a disposition is highly favorable to reducing losses and to increasing overall current density. The filaments are bundled together in bunches that are separated by small thicknesses of copper constituting a mesh capable of removing the heat which is produced.

Copper constitutes no more than 5% to 10% of the cross-section of the strand. The central strand may be made of copper, optionally cased in cupro-nickel.

Figure 3:
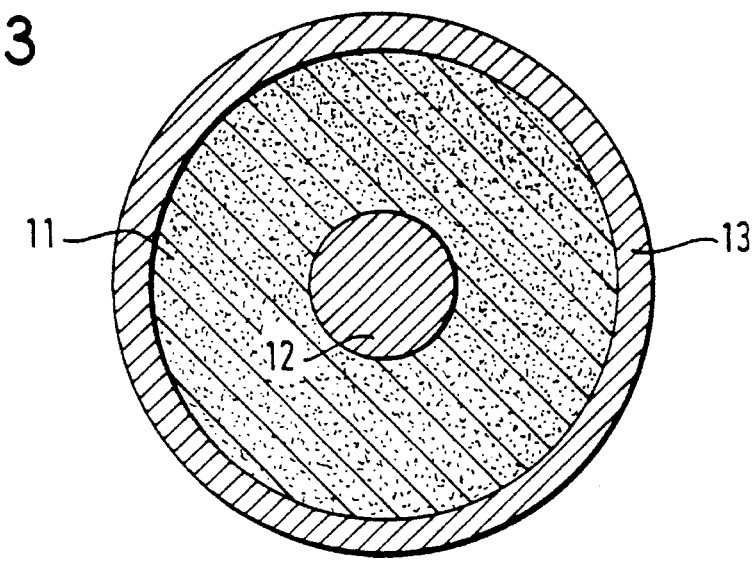
FIG. 3 is a cross-section through a single-strand superconductive conductor of the invention.

The invention also extends to a superconductive single strand in which the highly resistive filament region is in contact without cohesion with a core and/or a ring of low-resistance metal. This case is shown in FIG. 3 where the filament region 11 surrounds a core 12 without cohesion, and where a tube 13 surrounds the filament region, again without cohesion.

The lack of cohesion may be caused in this case by one of the following methods:

- assembling a billet in which the low-resistance parts are covered in a film of grease or of oxide;
- cold extrusion or extrusion at reduced temperature; or
- covering and drawing without extrusion.

We claim:

1. A superconductive conductor, made up of a single strand, protected against partial transitions, the conductor comprising a superconductive region made up of superconductive filaments embedded in a non-superconductive metal matrix, and a non-superconductive metal region, wherein the cold resistivity of the non-superconductive metal region is less than half the overall cold resistivity of the superconductive region in a non-superconductive state, the superconductive region and the non-superconductive metal region being merely in mechanical contact, without cohesion with said non-superconductive metal region being constituted by a core situated in the middle of a single superconductive region.

2. A superconductive conductor made up of a single strand, protected against partial transitions, the conductor comprising a superconductive region made up of superconductive filaments embedded in a non-superconductive metal matrix, and a non-superconductive metal region, wherein the cold resistivity of the non-superconductive metal region is less than half the overall cold resistivity of the superconductive region in a non-superconductive state, the superconductive region and the non-superconductive metal region being merely in mechanical contact, without cohesion, with said non-superconductive metal region being constituted by a sheath surrounding the superconductive region.

3. A superconductive conductor protected against part transitions, the conductor comprising a superconductive region made up of superconductive filaments embedded in a non-superconductive metal matrix, and a non-superconductive metal region, wherein the cold resistivity of the non-superconductive metal region is less than half the overall cold resistivity of the superconductive region in a non-superconductive state, the superconductive region and the non-superconductive metal region being merely in mechanical contact, without cohesion, wherein said superconductive region is constituted by at least one tape, and said non-superconductive metal region is constituted by at least one tape.

* * * * *